United States Patent [19]

Hyde et al.

[11] Patent Number: 4,888,554
[45] Date of Patent: Dec. 19, 1989

[54] ELECTRON PARAMAGNETIC RESONANCE (EPR) SPECTROMETER

[75] Inventors: James S. Hyde, Dousman, Wis.; Jerzy Gajdzinski, Cracow, Poland

[73] Assignee: MCW Research Foundation, Inc., Milwaukee, Wis.

[21] Appl. No.: 227,288

[22] Filed: Aug. 2, 1988

[51] Int. Cl.$^4$ .............................................. G01R 33/20
[52] U.S. Cl. .................................................. 324/316
[58] Field of Search ............... 324/300, 307, 316, 318, 324/322

[56] References Cited

U.S. PATENT DOCUMENTS

| | | | |
|---|---|---|---|
| 3,350,633 | 10/1967 | Hyde | 324/0.5 |
| 3,820,035 | 6/1974 | Meddaugh | 328/233 |
| 3,824,451 | 7/1974 | Freeman et al. | 324/0.5 R |
| 3,873,909 | 3/1975 | Ernst | 324/0.5 R |
| 4,593,248 | 6/1986 | Hyde et al. | 324/317 |
| 4,623,835 | 11/1986 | Mehdizadeh | 324/316 |
| 4,782,296 | 11/1988 | Schmalbein | 324/316 |

OTHER PUBLICATIONS

Electron Spin Resonance, Second Edition, A Comprehensive Treatise on Experimental Techniques by Charles P. Poole, Jr., pp. 87–92.

Primary Examiner—Michael J. Tokar
Attorney, Agent, or Firm—Quarles & Brady

[57] ABSTRACT

An electron paramagnetic resonance (EPR) spectrometer employing a reference arm microwave bridge provides efficient, simultaneous generation of orthogonal I and Q signals. The simultaneous generation is enabled through the use of a field effect transistor (FET) microwave amplifier in the signal arm feeding a balanced quadrature mixer. The I and Q signals are then combined to produce a signal suitable for use as a discriminator in an automatic frequency control (AFC) circuit. An important characteristic of the discriminator signal is that it is independent of the relative phase angle $\alpha$ between the reference arm and signal arm of the bridge. In a further embodiment, an apparatus is disclosed which computes $\alpha$ from the I and Q signals, and uses the computed value for $\alpha$ to extract pure absorption and pure dispersion information from the I and Q signals regardless of the setting of $\alpha$ in the bridge.

12 Claims, 6 Drawing Sheets

ELECTRON PARAMAGNETIC RESONANCE (EPR) SPECTROMETER

GOVERNMENT RIGHTS STATEMENT

The U.S. Government has a paid-up license in this invention and the right in limited circumstances to require the patent owner to license others on reasonable terms as provided for by the terms of Grant Nos. GM27665 AND RR01008 awarded by the National Institute of Health.

BACKGROUND OF THE INVENTION

The field of the invention is electron paramagnetic resonance (EPR) spectroscopy and, more particularly, the automatic frequency control of the spectrometer and acquisition of the EPR signals.

EPR measurements are usually performed utilizing a reference-arm microwave bridge such as that shown in U.S. Pat. No. 4,593,248. In such a system, a microwave source oscillator is tuned to the resonant frequency of a microwave resonator. The source oscillator output is divided onto two different paths; a reference arm and a signal arm. Both the reference arm and the signal arm include attenuators to adjust the signal strength in their respective paths.

The signal arm includes a circulator for coupling to a resonator containing the sample under study. The reference arm functions as a local oscillator and produces an output signal which is mixed with the circulator output. The resulting signal from the mixing process is then detected. In the detection process, the phase of the signal in the reference arm is critical, and must be adjusted to optimize the detected signal. For that purpose, prior bridges required a variable phase shifter in the reference arm.

Either one of two orthogonal EPR signals, referred to in the art as "Absorption" and "Dispersion", can be detected utilizing a single channel detector by suitable adjustment of the phase shifter in the reference arm. The oscillator is first tuned to the resonant frequency of the resonator. The sample in the resonator is then subjected to a strong d.c. "polarizing" magnetic field and at the same time irradiated by a radio frequency "source" magnetic field at the electron's frequency of precession.

At that point, gyromagnetic resonance occurs, changing the resonator quality factor, or "Q", and shifting the resonant frequency of the resonator. The absorption signal is associated with the change in resonator Q and is in-phase with the incident microwave signal. Because of the "in-phase" condition, the absorption mode signal is also associated with the "Real", or "Re" part of the complex reflection coefficient of the resonator. The dispersion signal is associated with the shift in resonant frequency, and is in-quadrature with the incident microwave signal. Analogously, the dispersion signal is also associated with the "Imaginary", or "Im" part of the complex reflection coefficient of the resonator. Appropriate setting of the phase shifter is thereby essential to detect pure absorption or pure dispersion signals, each mode requiring a phase setting 90° away from the other mode.

Proper phase adjustment in the reference arm is also critical to the operation of Automatic Frequency Control (AFC) circuits in prior reference arm bridges. The microwave source oscillator is frequency modulated at a rate below the source excitation frequency. The latter source excitation frequency as is well known in the art, is the frequency at which a magnetic field modulation is applied to the resonator, and consequently is also the frequency at which the EPR signals are received, usually about 100 kilohertz (kHz). The rate of frequency modulation of the microwave source is termed the AFC frequency, and is typically from 10–70 kHz. The modulation index of the AFC modulation is very low, so that the deviation of the microwave source oscillator from the desired resonant frequency is small.

Prior AFC circuits are known in the art, and operate by discriminating on the Real part (absorption mode) of the microwave energy reflected from the resonator at the AFC frequency, as explained in detail below. It was therefore necessary for the phase of the reference arm to be precisely set so that the detector used for the AFC signal is operated in the absorption mode. If the phase shifter were not optimally set, the AFC circuit performance would be degraded. And if the phase of the reference arm were far enough from optimum, AFC lock could be lost altogether.

The need for phase adjustment in the reference arm of prior bridges is a serious disadvantage. If the bridge is implemented utilizing waveguides, then rotary vane attenuators that have minimal phase shift can be employed. In that case, the phase is fairly stable, but still must be adjusted to ensure purely absorption or dispersion signals and, in some cases, to change between absorption/dispersion detection. If the bridge is implemented utilizing coaxial cable, the phase control problem is even worse. The attenuators currently known for use in coax have an accompanying attenuation dependent phase shift, so that each change of attenuator setting demands a change in reference-arm phase.

In addition to the AFC and phase shift problems enumerated above, prior reference arm bridges suffer from an inability to efficiently detect both absorption and dispersion signals simultaneously. To do so in prior bridges would require splitting the signal to be detected into two branches, each branch with half the signal power. Since separate detection in each branch introduces approximately the same amount of noise, each separate detection suffers a reduction in the signal to noise ratio (S/N) by a factor of $\sqrt{2}$.

SUMMARY OF THE INVENTION

In one aspect of this invention, an electron paramagnetic resonance (EPR) spectrometer includes a reference arm bridge comprised of a reference arm and a signal arm. Decoding means is connected to the outputs of the reference and signal arms for producing an EPR output signal. This invention provides the improvement in that the reference arm bridge includes a microwave amplifier connected between the output of the signal arm and the decoding means, and the decoding means comprises a quadrature mixer for simultaneously producing orthogonal EPR output signals.

An important object of the present invention is to efficiently provide for simultaneous acquisition of orthogonal EPR signals. The microwave amplifier may be of the low noise type, thereby establishing a noise floor before the EPR signals are detected. This allows the detector means to split the signal and detect it in quadrature without loss of signal to noise ratio. The microwave amplifier may be, for example, a field effect transistor (FET) amplifier with a noise figure less than approximately 3 dB and a voltage gain of greater than approximately 10 dB.

In another aspect of the invention, an electron paramagnetic resonance (EPR) spectrometer includes a variable frequency microwave oscillator for producing a microwave output signal at a frequency determined by a frequency control signal. A reference arm bridge is connected to the microwave oscillator. The reference arm bridge includes a reference arm, a signal arm, and a resonator coupled to the signal arm.

Quadrature decoding means are connected to the reference arm and signal arm of the reference arm bridge for simultaneously producing first and second detected signals in quadrature with respect to each other. Discriminator means are connected to the first and second detected signals for deriving a discriminator signal indicating the relative difference between the frequency of the microwave oscillator and the resonant frequency of the resonator. Most importantly, the discriminator signal according to this invention is independent of the relative phase angle between the reference and signal arms.

Finally, AFC circuit means are connected to the discriminator means and the oscillator means. The AFC circuit means produces the frequency control signal for maintaining the microwave oscillator frequency near the resonant frequency of the resonator based on the discriminator signal.

Another object of this invention is to provide an AFC system for an EPR spectrometer which maintains AFC lock despite variations in the relative phase angle between the reference arm and signal arm. In particular, the discriminator means may comprise means to perform a "sum of squares" of the orthogonal output signals. In that case, first squaring means are connected to the first detected signal for producing a first squared value. Second squaring means connected to the second detected signal for producing a second squared value. Summing means connected to the first and second squared values for producing the discriminator signal as the sum of the first and second squared values.

The AFC circuit means may include means for frequency modulating the microwave oscillator at an AFC modulation frequency. In that case, the discriminator means may include means for extracting only that component of the sum of the squares of the first and second detected signals at the AFC modulation frequency for use as the discriminator signal.

The first and second detected signals may each include direct current (d.c.) components and alternating current (a.c.) components at the AFC modulation frequency. The first and second squaring means may then perform a weighted squaring, giving a lesser gain to the d.c. components than to the a.c. components. This teaching of the present invention is important in mitigating to some extent spurious noise introduced in the reference arm bridge.

In yet another aspect of the invention, an improvement is provided for the automatic frequency control (AFC) system for an electron paramagnetic resonance (EPR) spectrometer of the type capable of producing a pure dispersion mode output signal. The improvement comprises the inclusion of discriminator signal generation means for producing a discriminator signal based on the AFC frequency component of the dispersion mode signal squared. Squaring means are provided having an input and an output, the input of the squaring means being connected to the pure dispersion mode output signal, and the output of the squaring means being the squared value of the pure dispersion mode output signal. Selection means are connected to the output of the squaring means, for selecting only the component of the squaring means output at the AFC modulation frequency for use as the discriminator signal.

In still another aspect of the invention, an electron paramagnetic resonance (EPR) spectrometer comprises a reference arm bridge, including a reference arm and a signal arm. Orthogonal detection means are connected to the reference arm bridge for producing first and second reference arm bridge output signals in quadrature with each other. Computation means are provided for calculating a value for the relative phase angle $\alpha$ between the reference arm and signal arm. Then, mode correction means produces a pure absorption EPR spectrum and a pure dispersion EPR spectrum by correcting the reference arm bridge output signals based on the relative phase angle $\alpha$.

Yet another object of this invention is to provide the ability to compute pure dispersion and absorption without the need of adjusting the phase angle $\alpha$. Doing so eliminates the need for a variable phase shifter in the reference arm bridge, and substantially simplifies operation.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DESCRIPTION OF THE PREFERRED EMBODIMENT

Figure 1:
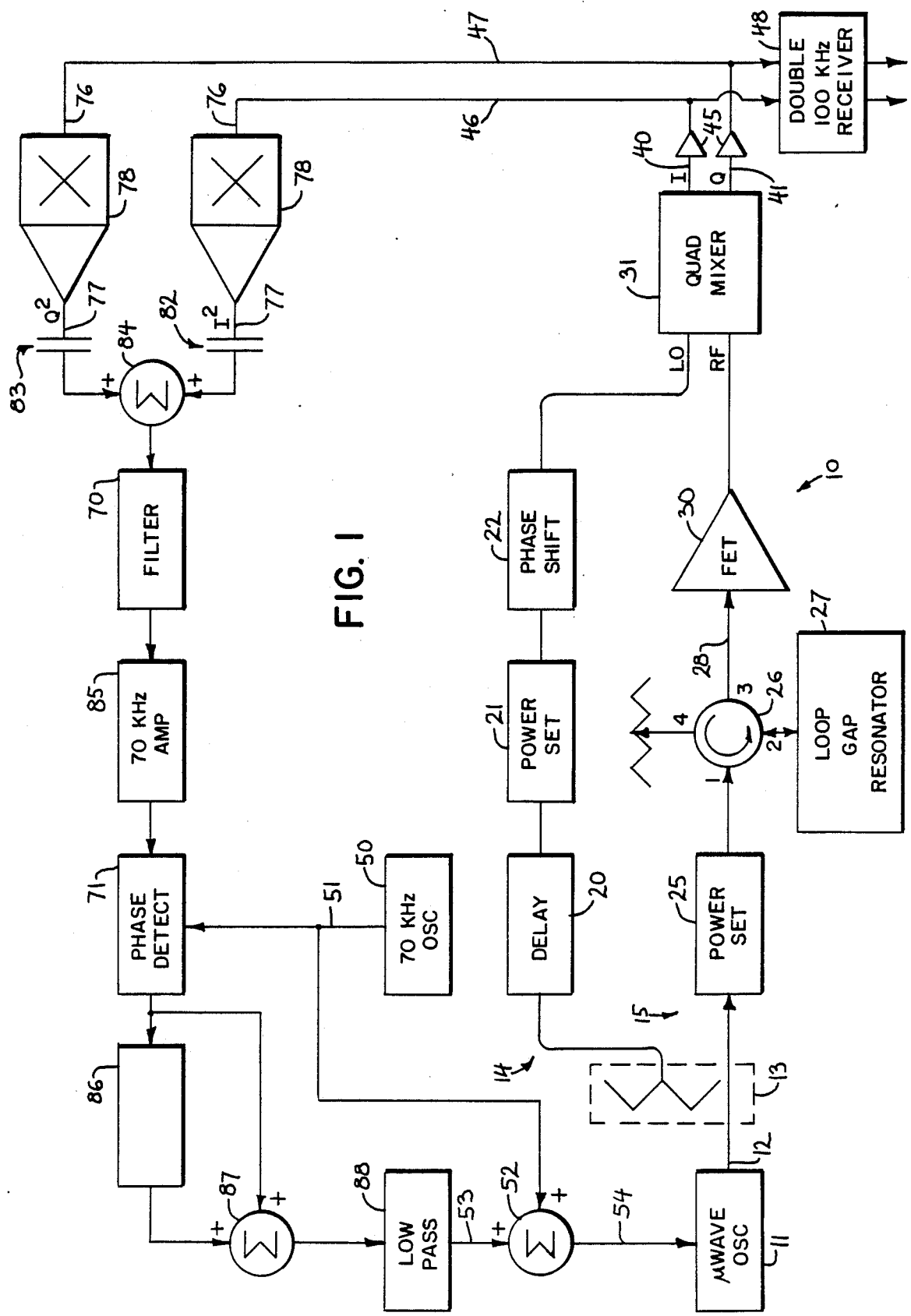
FIG. 1 is a block diagram of an electron paramagnetic resonance (EPR) spectrometer according to the present invention.

Referring to FIG. 1, an EPR spectrometer 10 includes a microwave oscillator 11 for generating an output signal on line 12. In the particular embodiment described herein, the EPR spectrometer operates in L band (1–2 GHz), and the oscillator is tunable within that range. The particular oscillator used is a model KDI CC-12, manufactured by KDI electronics, Whippany, N.J.

A portion of the oscillator output signal 12 is tapped by coupler 13 into a reference arm 14. The remainder of signal 12 continues on through a signal arm 15. The reference arm 14 includes a delay line 20 for matching delays in the signal arm 15, and a variable attenuator 21 for setting the power level of the reference arm signal.

The reference arm in this embodiment also includes a variable phase shifter 22. While the phase shifter 22 is included in this embodiment, other aspects of this invention, described below, serve to eliminate the need for the phase shifter 22. In simpler implementations, the phase shifter 22 is useable to set the phase of the reference arm signal such that the spectrometer 10 operates in pure absorption and dispersion modes as described below.

The signal arm 15 includes a second variable attenuator 25 for setting the power level in the signal arm 15. The output of the attenuator 25 is coupled to port 1 of a standard four port circulator 26. The particular circulator 26 used in this embodiment is model A4C-1030 available from Aertech (a subsidiary of TRW), Sunnyvale, CA. A resonator 27 is coupled to port 2 of the circulator. Port 3 of the circulator 26 is coupled to an output line 28, and port 4 is terminated.

The type of resonator 27 preferred in this embodiment is a loop-gap resonator, such as that described in U.S. Pat. No. 4,453,147, although a cavity resonator may also be used with this invention.

As is well known in the art, in order to produce an EPR spectrum, the resonator 27 is subjected to a polarizing magnetic field, and is modulated with an alternating magnetic field at a preset field modulation frequency, although the magnetic field elements are not shown in FIG. 1 for simplicity of illustration.

In prior reference arm bridges, the coupler output on transmission line 28 was directly mixed with the reference arm signal and detected. It was therefore not advantageous to split the signal on transmission line 28 for simultaneous detection of both absorption and dispersion signals, since to do so would result in degradation of the signal-to-noise ratio (S/N) in each split signal by a factor of $\sqrt{2}$. Instead, only one signal, either absorption or dispersion, was detected at any one time.

In this invention, the signal arm 15 includes an amplifier 30 feeding the radio frequency (RF) input of a balanced quadrature mixer 31. The amplifier 30 is a low loss microwave amplifier with a very low noise figure, and is impedance matched to the transmission line 28. Currently known microwave amplifiers of this type typically employ Field Effect Transistor amplification and are referred to as "FET" microwave amplifiers, although other types of amplifiers suitable for the purpose may equally be used. The particular amplifier preferred in this embodiment is a FET microwave amplifier type AM-2A-1020, manufactured by Miteq, Hauppauge, N.Y.

The main criteria for the amplifier 30 is that is possess a low noise figure and a gain of at least approximately 10 dB at the microwave frequency employed. In that way, noise introduced in the quadrature mixer 31 has much less effect on the S/N ratio of the amplified signal, as the "noise floor" is established by the amplifier 30. The AM-2A-1020 amplifier has a gain of 18 dB and a noise figure of 2 dB.

Figure 2:
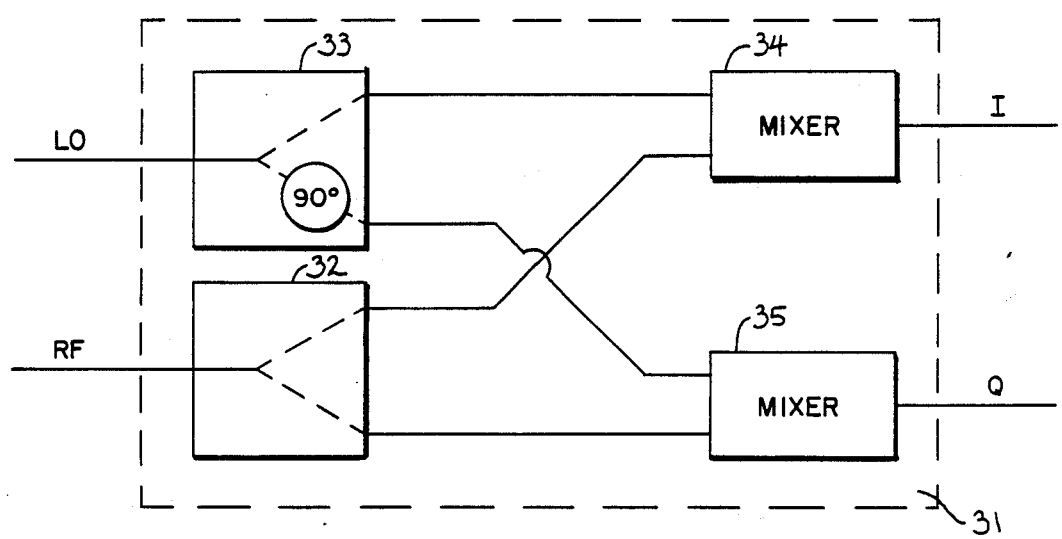
FIG. 2 is a schematic diagram of the quadrature mixer which forms a part of the spectrometer of FIG. 1.

Referring to FIG. 2, the balanced quadrature mixer 31 comprises an in-phase power divider 32, a 90° hybrid coupler 33, and two double balanced mixers 34 and 35. The RF input signal is connected to divider 32. The outputs of divider 32 are both in phase, and each one is connected to one input of one of the mixers 34 and 35. Coupler 33 divides the LO signal, and also shifts one of the split signals by 90°. The in-phase output of coupler 33 is connected to mixer 34, while the 90° shifted output is connected to mixer 35.

The components preferred for the quadrature mixer 31 are listed in the following table:

| In-phase divider 32 | Model 2APD-2; Mini-Circuits, Brooklyn, N. Y. |
|---|---|
| 90° Coupler 33 | Model 10265-3; Anaren, Syracuse, N. Y. |
| Mixers 34 and 35 | Model DMF-64-1500; Merrimac, West Caldwell, N. J. |

As an alternative to the construction of FIG. 2, prefabricated quadrature mixers are available and may be used, for example, model RR-12 manufactured by Triangle Microwave, East Hanover, N.J.

The use of a low noise amplifier prior to mixing, and the subsequent use of a quadrature mixer is an important aspect of this invention, as it allows the simultaneous acquisition of both absorption and dispersion mode signals.

Referring again to FIG. 1, the outputs 40 and 41 of quadrature mixer 31 are therefore in quadrature with each other, and are designated as the "I" and "Q" signals, respectively. As discussed in greater detail below, when the phase shifter 22 is adjusted such that the I signal is purely absorption mode, or the Real part of the reflected energy, then the Q signal is purely dispersion mode, or the Imaginary part of the reflected energy. These I and Q signals are connected through preamplifiers 45 to produce buffered I and Q signals 46 and 47, respectively.

The I and Q signals 46 and 47, respectively, are then connected as inputs to a double 100 kHz receiver 48. 100 kHz is chosen in this embodiment as the frequency of the field modulation frequency. The receiver 48 includes dual receiver channels, each one of which is of the construction known in the art for single receiver channels. The receiver 48 thereby separately decodes the actual absorption and dispersion signals. The I and Q signals may then be processed in the normal fashion well known in the art, except that in this invention both signals are available and may be processed simultaneously.

The advantages of simultaneous acquisition of both the I and Q signals with improved S/N performance should be apparent to those skilled in the art. However, this invention also utilizes the simultaneous availability of both the I and Q signals in additional novel aspects. The first such aspect provides for an improved Automatic Frequency Control (AFC) system, which will be described in more detail below, and the second additional aspect of this invention is the extraction of pure absorption and dispersion information from the I and Q signals independently of the reference arm-to-signal arm phase angle $\alpha$. This latter aspect, described later in a second preferred embodiment, allows the phase shifter 22 to be eliminated completely from the reference arm, thereby substantially simplifying the spectrometer structure and operation.

Referring again to FIG. 1, the AFC system of this invention can now be described. A 70 kHz oscillator 50 generates a 70 kHz sinusoidal signal on line 51. The 70 kHz signal 51 is connected as one input to summer 52.

The other input of summer 52 is a correction signal 53, which is developed by the remainder of the AFC circuit as described below. The output 54 of summer 53 is connected as a frequency control input to the microwave oscillator 11. The output frequency of oscillator 11 is thereby frequency modulated in a narrow band by the 70 kHz component, and shifted over a larger range by the correction signal 53.

Referring to FIGS. 3a–3d, the microwave power returned from the resonator 27 as a function of the frequency of the incident microwave signal is in the form of a U-shaped dip near resonance. This dip is represented by traces 60a–60d, and is directly related to the resonator reflection coefficient, termed "Γ". The frequency modulated incident microwave signal varies sinusoidally about a center frequency near resonance, as represented by traces 61a–61d. As the input frequency varies, the reflected power from the resonator varies according to the response represented by traces 60a–60d, resulting in a varying reflected power, represented by trace 62a–62d, respectively.

Figure 3A:
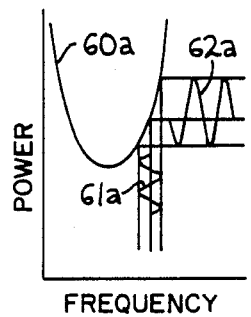
FIGS. 3a–3d are plots of the reflected power near resonance versus incident frequency for the resonator which forms a part of the spectrometer of FIG. 1.
Figure 3B:
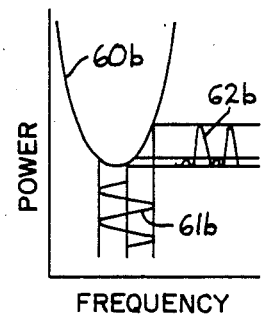
Figure 3C:
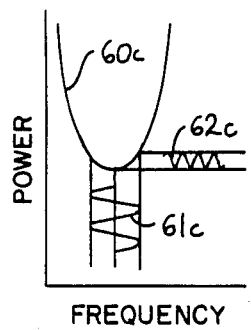
Figure 3D:
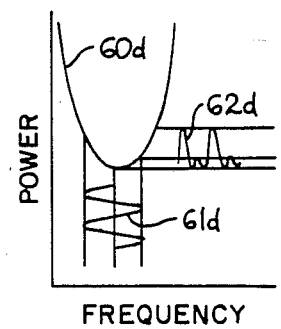

FIGS. 3a–3d depict four different examples of the center frequency of the frequency modulated oscillator 11; far off resonance (FIG. 3a), slightly above resonance (FIG. 3b), on resonance (FIG. 3c), and slightly below resonance (FIG. 3d). In each case, the reflected power represented by traces 62a–62d is characteristic of the center frequency position relative to resonance, and can be decoded to deduce the same, as described in detail below.

Referring to FIGS. 4a–4d, the reflected power from the resonator as represented by signals 62a–62d can be characterized in terms of the reflection coefficient Γ expressed as a sum of real (Re) and imaginary (Im) parts. The real and imaginary parts correspond to microwave signals reflected from the resonator that are in-phase and in-quadrature, respectively with respect to the incident microwave signal. In addition, the reflected signals 62a–62d include both real and imaginary components at d.c., the fundamental AFC frequency, and harmonics of the fundamental AFC frequency.

In the analysis that follows, the total response (62a–62d) due to real and imaginary parts of the reflection coefficient Γ are represented as Re[Γ] and Im[Γ]. These total responses Re[Γ] and Im[Γ] include d.c. components represented as the real and imaginary parts (zero'th derivative) of the reflection coefficient Γ, represented as ReΓ and ImΓ, and components at the fundamental AFC frequency represented as the first partial derivative of the real and imaginary parts of the reflection coefficient Γ, $\partial/\partial x[Re\Gamma]$ and $\partial/\partial x[Im\Gamma]$. Similarly, higher harmonics of the AFC frequency correspond to higher derivatives of the real and imaginary parts.

Representing the resonant frequency of the resonator as $\omega_o$, the incident microwave frequency as $\omega$, and a quantity $\Delta\omega$ as the difference between the incident frequency and resonance ($\omega - \omega_o$), the reflection coefficient Γ can be expressed as:

$$[\Gamma(\Delta\omega)] = \frac{\beta^2 - 1 - \left(2Q_0 \frac{\Delta\omega}{\omega_o}\right)^2}{(\beta + 1)^2 + \left(2Q_0 \frac{\Delta\omega}{\omega_0}\right)^2} - \tag{1}$$

$$j \frac{4Q_0 \frac{\Delta\omega}{\omega_0} \beta}{(\beta + 1)^2 + \left(2Q_0 \frac{\Delta\omega}{\omega_0}\right)^2}$$

Where:
j is the imaginary operator ($\sqrt{-1}$)
β is the resonator coupling coefficient, and
$Q_o$ the unloaded Q of the resonator.

The oscillator frequency is modulated at a radian frequency of $\omega_m$. For an AFC center frequency of 70 kHz in this embodiment, $\omega_m = (70 \text{ kHz} * 2\pi)$ radians/sec. A low index of modulation is used to limit deviation of the microwave oscillator. A quantity $\overline{\Delta\omega}$ can then be defined as the average frequency difference between the oscillator frequency and the resonant frequency of the resonator such that:

$$\Delta\omega = \overline{\Delta\omega} + \epsilon \cos(\omega_m t) \tag{2}$$

The 70 kHz components (AFC fundamental frequency) of the voltage reflection coefficient are then:

$$Re[\Gamma(\Delta\omega)]_{70 \, kHz} = \epsilon\cos(\omega_m t) \frac{\partial}{\partial \Delta\omega} [Re\Gamma(\overline{\Delta\omega})] \tag{3}$$

$$Im[\Gamma(\Delta\omega)]_{70 \, kHz} = \epsilon\cos(\omega_m t) \frac{\partial}{\partial \Delta\omega} [Im\Gamma(\overline{\Delta\omega})] \tag{4}$$

Figure 4A:
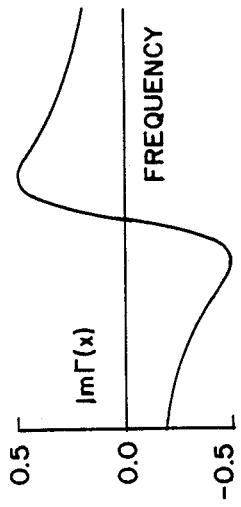
FIGS. 4a–4d are plots of real and imaginary d.c. and a.c. components of the reflection coefficient for the resonator which forms a part of the spectrometer of FIG. 1.

In equations (3) and (4), $\Gamma(\Delta\omega)$ is obtained from Equation (1) by substituting $\overline{\Delta\omega}$ for $\Delta\omega$. Equations (3) and (4) thereby describe the response at the 70 kHz AFC frequency. The d.c. responses are simply $Re\Gamma(\overline{\Delta\omega})$ and $Im\Gamma(\overline{\Delta\omega})$. As such, the d.c. responses $Re\Gamma(\overline{\Delta\omega})$ and $Im\Gamma(\overline{\Delta\omega})$ are only a function of the AFC center frequency ($\overline{\Delta\omega}$), and are depicted in FIGS. 4a and 4b, respectively. The response at the AFC frequency is both time varying ($\cos(\omega_m t)$) and a function of the center frequency ($\overline{\Delta\omega}$). When decoded, as described below, the time varying portions of the responses at the AFC frequency are removed, leaving the responses $\partial/\partial\Delta\omega[Re\Gamma(\overline{\Delta\omega})]$ and $\partial/\partial\Delta\omega[Im\Gamma(\overline{\Delta\omega})]$ shown in FIGS. 4c and 4d, respectively.

In order for an AFC circuit to operate, a signal must be developed which possess discriminator characteristics. That is, the discriminator signal must approach zero as $\overline{\Delta\omega}$ (e.g. the difference between the average resonant frequency of the oscillator and the resonant frequency of the resonator) approaches zero, and at $\overline{\Delta\omega} = 0$, the phase of the discriminator signal must invert.

In prior AFC circuits, the real, or in-phase, portion of the resonator response at the AFC frequency (equation (3)) was almost universally used as the single discriminator for locking the oscillator 11 onto the resonant frequency of the resonator 27. To do so, the in-phase, or "I" signal was demodulated and detected, usually by a single square law detector (not shown). The single detected I signal was then filtered by a filter 70 to remove higher harmonics of the AFC frequency, and then passed through a phase sensitive detector 71 referenced to the AFC oscillator signal 51.

Figure 4C:
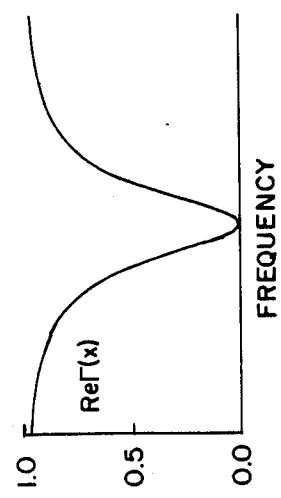
Figure 4B:
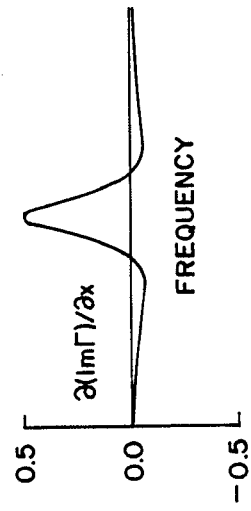
Figure 4D:
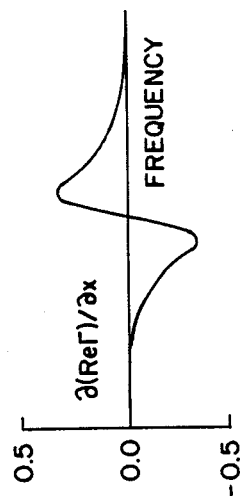

The phase sensitive detector 71 ignores all even harmonics of the AFC frequency, leaving only the response $\partial/\partial\Delta\omega[Re\Gamma(\overline{\Delta\omega})]$ as represented in FIG. 4c. Note that the response of FIG. 4c has the desired discriminator characteristics. The imaginary d.c. response of FIG. 4b also has discriminator characteristics, and AFC circuits based on such d.c. response are known in the art, but are not as widely used in the art due to other problems associated with their use. In any event, prior AFC circuits operated by utilizing a single EPR signal as the discriminator signal.

Further, the discriminator signal used by prior AFC circuits was highly dependant on the relative phase between the reference arm 14 and the signal arm 15. That relative phase is designated herein as $\alpha$. In prior AFC circuits, $\alpha$ must be adjusted, by phase shifter 22, such that the "I" signal is detected as the pure in-phase, or real, part of the response. Otherwise, the magnitude of the desired discriminator signal in the I signal would be diminished, as the I signal would then contain components of both the real and imaginary responses. If the phase $\alpha$ is sufficiently maladjusted, the prior AFC circuit may lose AFC lock altogether.

One important aspect of this invention is that a discriminator signal is developed which is independent of the phase angle $\alpha$. To do so requires the simultaneous access to both the I and Q signals, as provided by a previously described aspect of this invention. The complete description of an AFC system according to this invention now follows.

The complete resonator response can be approximated, ignoring higher harmonics, by including the real and imaginary d.c. responses with the responses at the AFC frequency (equations (3) and (4)) to yield:

$$Re[\Gamma(\Delta\omega)] \simeq [Re\Gamma(\overline{\Delta\omega})] + \epsilon \cos(\omega_m t) \partial/\partial\overline{\Delta\omega}[Re\Gamma(\overline{\Delta\omega})] \quad (5)$$

$$Im[\Gamma(\Delta\omega)] \simeq [Im\Gamma(\overline{\Delta\omega})] + \epsilon \cos(\omega_m t) \partial/\partial\overline{\Delta\omega}[Im\Gamma(\overline{\Delta\omega})] \quad (6)$$

Voltages as determined by Equations (5) and (6) are incident on the RF input of the double balanced quadrature mixer 31. The local oscillator (LO) input of the mixer 31 is fed by the output of the reference arm 14. The angle $\alpha$ describes the difference in pathlengths, expressed in terms of degrees of electrical phase difference, between the reference arm and the signal arm of the microwave bridge.

After demodulation in the balanced quadrature mixer 31, with the LO signal at an angle $\alpha$ with respect to the RF input, the I and Q voltages, $V_I$ and $V_Q$, respectively, can be expressed as:

$$\frac{V_I}{\sqrt{P_o}} \sim Re[\Gamma(\Delta\omega)]\cos(\alpha) - Im(\Gamma(\Delta\omega)]\sin(\alpha) \quad (7)$$

$$\frac{V_Q}{\sqrt{P_o}} \sim Re[\Gamma(\Delta\omega)]\sin(\alpha) + Im[\Gamma(\Delta\omega)]\cos(\alpha) \quad (8)$$

Where:
$P_o$ is power incident on the bridge.

It is critical to note that in equations (7) and (8), it has not been assumed that $\alpha$ has been adjusted to produce pure real and imaginary components on the I and Q signals, as had been necessary with prior AFC circuits. Equations (7) and (8) are therefore the general description of the I and Q responses, based on an arbitrary reference arm to signal arm phase angle $\alpha$.

A fundamental principle of this invention is that a discriminator signal suitable for AFC purposes, which is independent of $\alpha$, can be formed by suitable combination of the I and Q signals. In this embodiment, the preferred combination is the sum of squares of the respective I and Q signals. Mathematically, equations (7) and (8) may be squared and summed to yield:

$$\frac{V_I^2 + V_Q^2}{P_o} \sim \{Re[\Gamma(\Delta\omega)]\}^2 + \{Im[\Gamma(\Delta\omega)]\}^2 \quad (9)$$

Equation (9) can be expanded by substituting the previously described formulas for $[\Gamma(\Delta\omega)]$ in equations (1)–(6) and carrying out the squaring and summing process. Considerable simplification occurs due to cancellation of factors, which is not shown here for simplicity. However, a key result of that expansion is that the component at the AFC frequency of equation (9) can be expressed as:

$$\frac{V^2(70 \text{ kHz component})}{P_o} = \quad (10)$$

$$\frac{8\beta\left(\frac{2Q_o}{\omega_o}\right)^2 \Delta\omega}{(\beta+1)^2 + \left(2Q_o\frac{\Delta\omega}{\omega_o}\right)^2} \epsilon\cos(\omega_m t)$$

Where:

$$V^2 = V_I^2 + V_Q^2$$

Equation 10 is independent of $\alpha$ and will be shown below to possess, after decoding, the desired discriminator characteristic. The quantity $\alpha$ has dropped out. An AFC circuit of this invention is therefore independent of the reference-arm phase. The AFC lock-point is also independent of the resonator coupling coefficient, $\beta$, although severe mismatch will lower the amplitude of the available I and Q signals.

Wave forms associated with the above analysis are shown in FIGS. 5a–5f. Equations (5) and (6) are of the general form $(A+B\cos(\omega_m t))$. When these equations are squared to arrive at equation (9), the general form of the result is $(A^2+2AB\cos(\omega_m t)+B^2\cos^2(\omega_m t))$. In other words, terms result which are at d.c., $\cos(\omega_m t)$ and $\cos^2(\omega_m t)$. The $\cos^2(\omega_m t)$ terms can be ignored, since they are comprised of higher harmonics of the AFC frequency and are eliminated by the filtering and phase sensitive detection of the AFC circuit described below.

Figure 5A:
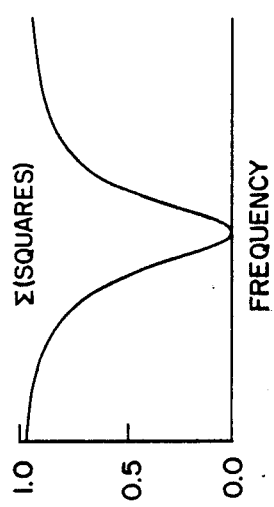
FIGS. 5a–5f are plots of the d.c. and a.c. open loop terms produced by the automatic frequency control (AFC) circuit which forms a part of the spectrometer of FIG. 1.
Figure 5B:
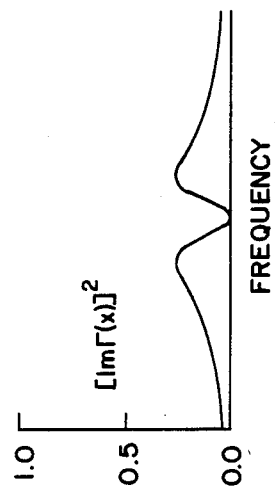
Figure 5C:
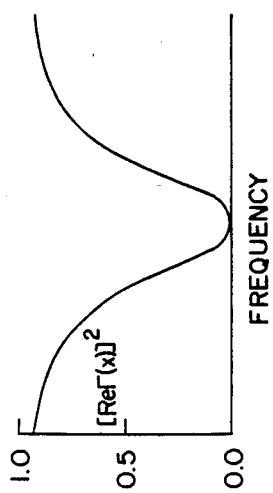

The respective real and imaginary d.c. terms of equation (9) are shown in FIGS. 5a–5b, labeled $[Re\Gamma(x)]^2$ and $[Im\Gamma(x)]^2$. These are obtained directly from equation (1), assuming $\beta=1$. Their sum is shown as $\Sigma(\text{SQUARES})$ in FIG. 5c. The cross terms are the relevant ones from the point-of-view of the AFC circuit described here since they are at $\cos(\omega_m t)$. From equations (5) and (6):

$$\begin{aligned} \text{Real} \\ \text{Cross} \\ \text{Term} \end{aligned} = 2Re\Gamma(\overline{\Delta\omega})\,\epsilon\cos(\omega_m t)\frac{\partial}{\partial\overline{\Delta\omega}}[Re\Gamma(\overline{\Delta\omega})] \quad (11)$$

$$= \frac{\partial}{\partial\overline{\Delta\omega}}[Re\Gamma(\overline{\Delta\omega})]^2\,\epsilon\cos(\omega_m t)$$

Similarly,

-continued $$\text{Imaginary Cross Term} = 2Im\Gamma(\overline{\Delta\omega})\,\epsilon\cos(\omega_m t)\,\frac{\partial}{\partial\overline{\Delta\omega}}[Im\Gamma(\overline{\Delta\omega})] \quad (12)$$

$$\equiv \frac{\partial}{\partial\overline{\Delta\omega}}[Im\Gamma(\overline{\Delta\omega})]^2\,\epsilon\cos(\omega_m t)$$

Figure 5D:
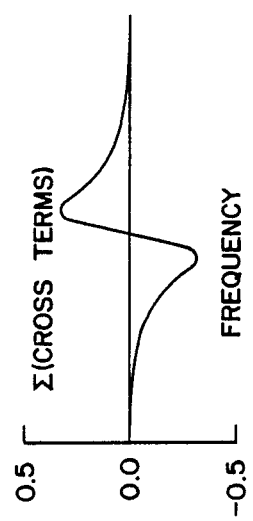
Figure 5E:
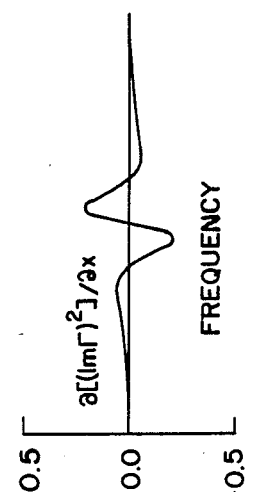

The waveforms corresponding to equations (11) and (12) are shown in FIGS. 5d and 5e labeled as $\partial(Re\Gamma)^2/\partial x$ and $\partial(Im\Gamma)^2/\partial x$, respectively. It should be noted that the waveforms of FIGS. 5d and 5e may be obtained identically either by taking derivatives of $[Re\Gamma(x)]^2$ and $[Im\Gamma(x)]^2$ (FIGS. 5a and 5b, respectively) or alternatively by multiplying from FIGS. 4a and 4b; $Re\Gamma(x)\times\partial(Re\Gamma)/\partial x$ and, correspondingly, $Im\Gamma(x)\times\partial(Im\Gamma)/\partial x$.

Figure 5F:
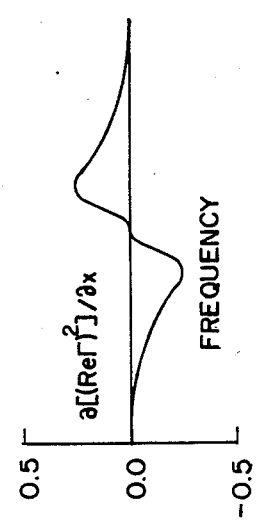

Both cross terms in FIGS. 5d and 5e are odd, e.g. asymmetrical about the center frequency. The sum of the cross terms, resulting from summing the squares in equation (9), is shown in FIG. 5f, and is also odd. All three cross terms, FIGS. 5d–5f have discriminator characteristics and can be used for AFC purposes. However, $\partial(Re\Gamma)^2/\partial x$ in FIG. 5d has an undesirable inflection at the center frequency and the AFC lock to this point can be expected to be very soft. $\partial(Im\Gamma)^2/\partial x$ in FIG. 5e shows very sharp discriminator characteristics at the center frequency, but also has undesirable anti-lock characteristics off-resonance.

The sum of cross terms, FIG. 5f, has ideal discriminator characteristics and is the basis of the AFC system in this embodiment. This curve is obtained from equation (10) by setting $\beta=1$. It should be noted that the cross term sum of FIG. 5f is identically equal to $\partial(Re\Gamma)/\partial x$ of FIG. 4c, although this is true only for $\beta=1$. Thus the AFC circuit described here where the cross term sum is used as the discriminator can be expected to perform in a similar manner to prior EPR AFC circuits which used $\partial(Re\Gamma)/\partial x$ as the discriminator. However, the AFC circuit of this invention provides the additional advantage that the reference-arm phase angle is no longer of relevance. It should also be noted that the sum of the cross terms in FIG. 5f is the partial derivative of the sum of the squares in FIG. 5c.

It should be apparent to those skilled in the art that it is also possible for an AFC circuit to discriminate on the waveforms of FIGS. 5d and 5e. In that case, the discriminating signal would be derived from either $V_I^2$ and $V_Q^2$ separately. When $\alpha=0$ or $90°$, both of these locks are at $\overline{\Delta\omega}=0$, but for other phase angles, the lock points are above or below $\overline{\Delta\omega}=0$. Always, the mean value of the lock-points in the I and Q channels corresponds to $\overline{\Delta\omega}=0$.

In other words, it is effectively the power reflected from the resonator that is used for AFC purposes. This has been done in prior EPR spectrometers using square-law detectors. As will be described below, in this invention the terms $V_I^2$ and $V_Q^2$ are formed using linear demodulation and analog squaring devices, which have much higher conversion gain than the square-law detectors used in the past. Superior results can thereby be achieved using an AFC discriminator signal based on either $V_I^2$ or $V_Q^2$ alone, or preferably on the above described phase angle independent combination thereof.

Figure 1A:
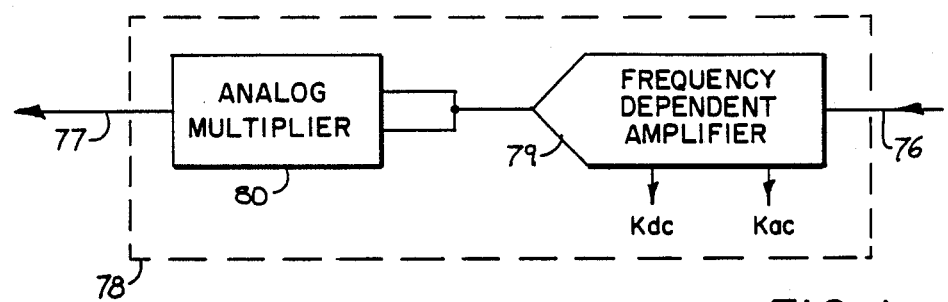
FIG. 1a is a block diagram of the multiplier circuit which forms a part of the spectrometer of FIG. 1.

Referring again to FIG. 1, an AFC circuit according to this invention which implements the above described control theory can now be described. The I signal 46 is applied to a first multiplier 78. Similarly, the Q signal is applied to a second multiplier 78. Referring to FIG. 1a, each multiplier 78 includes a frequency dependent amplifier 79, feeding both inputs of an analog multiplier 80. As a result, the squared value of the input on line 76 is placed on output 77.

The AFC circuit described in this embodiment depends on the sum of the cross terms which in turn is a product of d.c. and a.c. terms. For $\beta=1$ and with the oscillator at resonance, (FIGS. 3a–3b and 4a–4c) the d.c. terms are zero. If $\beta\neq1$ or $x\neq0$, a concern may arise regarding large amounts of noise very close to the carrier that would be up-converted to 70 kHz by formation of the cross term. This effect would depend on phase-noise characteristics of the oscillator and on the Q of the resonator. Such effects have been noted in practice, but can be mitigated to some extent as follows. The AFC circuit described in this embodiment does not necessarily require that the gain of the d.c. term and the gain of the a.c. (70 kHz) term be equal in I and Q before squaring, merely that both terms must be present. In other words, if the form of the original I and Q terms is ($A+B\cos(\omega_m t)$), then unequal amplification factors $K_{dc}$ and $K_{ac}$ may be applied to the respective d.c. and a.c. components in multipliers 78 before squaring.

The frequency dependent amplifier 79 shown in FIG. 1a selectively applies the amplification factors to the input 76 to the corresponding frequency range as noted above. Preferably, $K_{dc}$ is substantially less than $K_{ac}$ to suppress the introduction of low frequency noise into the cross term. The resulting term ($K_{dc}A+K_{ac}B\cos(\omega_m t)$) is less susceptible to up-conversion of d.c. noise while still retaining the desired discriminator characteristics after squaring. For the AFC circuit at L-band described above, a d.c. to a.c. gain ratio ($K_{dc}/K_{ac}$) of $-20$ dB has been empirically determined by applicants to be satisfactory.

Still referring to FIG. 1a, the analog multiplier 80 preferred in this embodiment is a type MPY 534, manufactured by Burr-Brown, Tucson, AZ. The MPY 534 devices are low noise and have an upper frequency limit of about 1 MHz, which is more than adequate for the 70 kHz AFC frequency chosen for this embodiment. Other types multipliers 80 may be used, provided that the noise level and frequency response are suitable for the application.

It is important to note that the inputs to the multipliers 80 must be d.c. coupled in order to form the cross terms as described above. Recall that the I and Q signals are of the form ($A+B\cos(\omega_m t)$). The cross term "$AB\cos(\omega_m t)$" is therefore dependent on the d.c. term "$A$", which must be included when performing the squaring, or else the 70 kHz component would be zero after squaring.

However, it should be noted that the d.c. component in I and Q arises only from the microwave RF input signal; there is no d.c. component at the mixer output from the LO input in a balanced mixer. This is a critical point in the circuit described in this embodiment. A single-ended mixer where the d.c. component depends on both LO and RF inputs would not be satisfactory.

Referring again to FIG. 1, multipliers 78 are linear devices, the use of which in an EPR AFC circuit is a particularly novel aspect of this invention. The respective outputs of the two multipliers 78 correspond to $I^2$ and $Q^2$. Blocking capacitors 82 and 83 are connected between the outputs of multipliers 80 and 81, respectively, and the inputs of a summer 84. The blocking capacitors 82 and 83 eliminate the d.c. terms in the $I^2$ and $Q^2$ signals, leaving only the 70 kHz components and higher harmonics.

The summer 84 performs the sum of the alternating current (a.c.) components in the I and Q signals, and directs the result to filter 70. Filter 70 is a low pass filter designed to pass the 70 kHz AFC frequency. One main function of the filter 70 is to attenuate the third and higher odd harmonics of the AFC frequency. Only the 70 kHz fundamental component of the AFC frequency is passed. Even harmonics are not a concern, as they are rejected by the phase sensitive detector 71. Another function of the filter 70 is to ensure that the closed loop gain of the AFC circuit is below unity at the 100 kHz EPR field modulation frequency. Otherwise, the AFC circuit would be unstable.

The output of filter 70 is amplified by a 70 kHz amplifier 85, and then applied to an input of phase sensitive detector 71. Output 51 of the 70 kHz reference oscillator 50 is applied to the phase reference input of the phase sensitive detector 71. The output of phase sensitive detector 71 is then the desired discriminator signal as described above and shown in FIG. 5f.

The output of phase sensitive detector 71 is processed in the normal manner, well known in the art, by integrator 86, summer 87, and low pass filter 88 to produce the error signal 53.

In the above described AFC circuit, considerable attention was paid to equalizing the gain and matching phase shifts in the I and Q channels. Gains were 40 dB and flat to 5 MHz.

Good performance of the AFC circuit described herein has been noted with the 70 kHz modulation amplitude adjusted such that the modulation sidebands were 35 dB below the carrier as determined using a Hewlett-Packard, Palo Alto, CA., 8566A spectrum analyzer at 1 mW of incident power and the AFC loop-gain was held approximately constant by varying the AFC modulation amplitude inversely with $\sqrt{P_o}$.

A change in coupling coefficient $\beta$ does not shift the lock-point significantly. More particularly, an arbitrary microwave voltage added to Re$\Gamma$ does not shift the lock-point, but one added to Im$\Gamma$ will cause error. Thus, poor isolation of the circulator or spurious reflections from the cavity arm that are in-phase with respect to Im$\Gamma$ are detrimental and should be reduced as much as possible.

Figure 6:
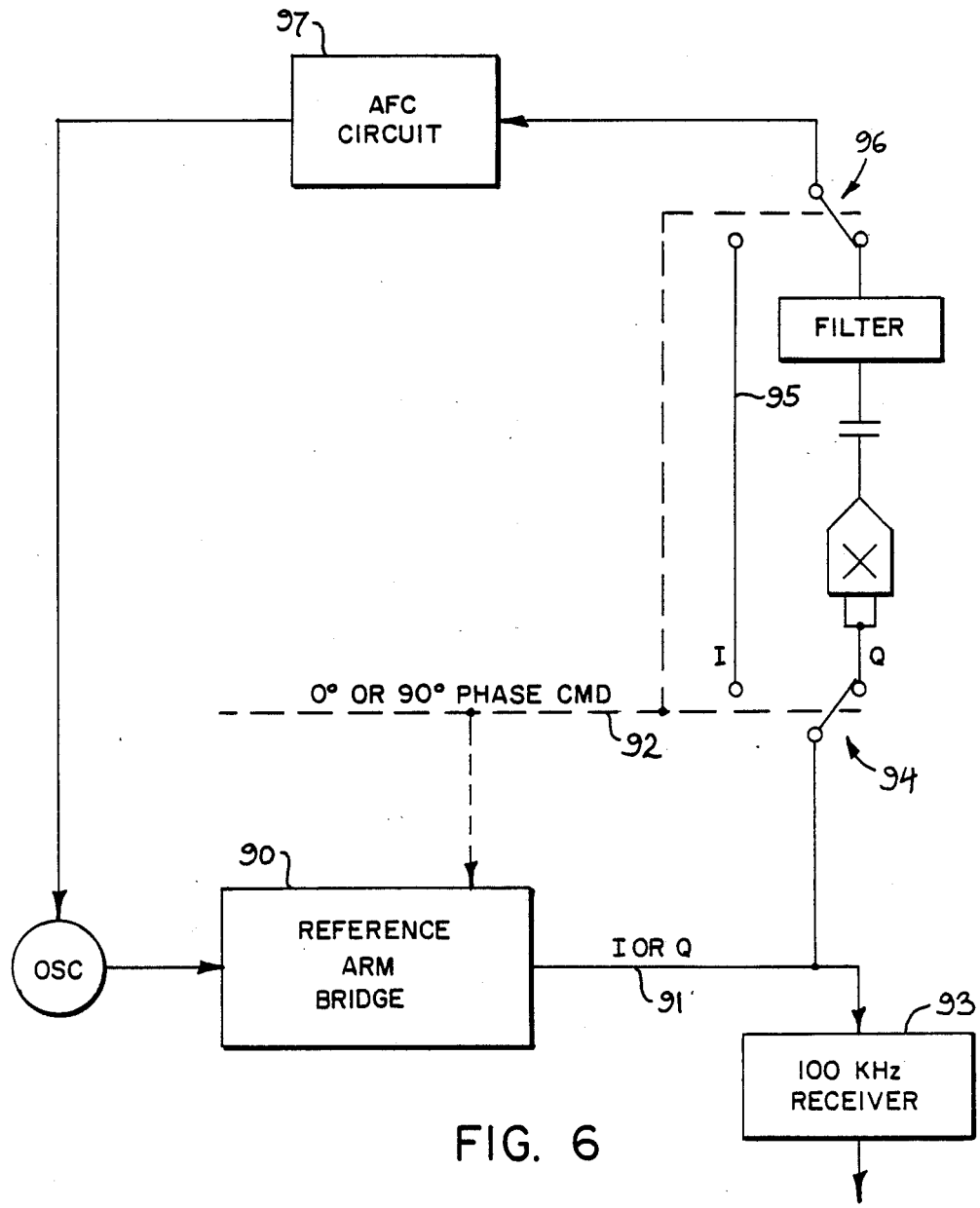
FIG. 6 is a block diagram of a second embodiment of a spectrometer according to the present invention.

Referring to FIG. 6, a second embodiment of the invention is shown based on a single ended EPR spectrometer. In prior spectrometers of this type, the AFC circuit could only operate with the reference arm phase shifter adjusted for absorption mode. In order to acquire dispersion mode signals, it was then necessary to first achieve AFC lock in absorption mode, and then quickly switch to dispersion mode before the oscillator drifts off resonance. According to another aspect of this invention, a single ended AFC discriminator signal can be derived, as described above, from the a.c. component at the AFC frequency of $Q^2$ alone (FIG. 5e).

In this second embodiment of the invention, a single ended reference arm bridge 90 is employed, which is capable of supplying either an I or Q signal on an output line 91. The selection of mode is accomplished by a phase command 92, which causes the phase of the reference arm (not shown) in the bridge 90 to assume the proper phase. The selected I or Q signal on line 91 is then processed by receiver 93 in the normal fashion. Output line 91 is also connected to a switch 94. The switch 94 is thrown in response to the same phase command 92. If the switch 94 is in an "I" position, a straight connection 95 is made to a companion switch 96, also operated in response to the phase command 92. The output of switch 96 is connected as the discriminator input to the conventional AFC circuit 97. In the "I" position, the absorption mode signal I is already the discriminator used by prior AFC circuits, so no additional processing is needed.

If the phase command 92 commands the dispersion mode, then switches 94 and 96 are placed in the "Q" position. In the "Q" position, the Q signal on line 91 is connected to both inputs of an analog multiplier 98. The output of multiplier 98 is $Q^2$, and is routed through capacitor 99 and low pass filter 100 to remove the d.c. component and higher harmonics, respectively, as described above. The output of filter 100 is therefore the AFC frequency component (FIG. 5e), and is connected to switch 96. In the "Q" position, switch 96 connects the output of filter 100 as the discriminator input to the AFC circuit 97.

The spectrometer of FIG. 6 is thereby enabled to maintain AFC lock while tuned to dispersion mode signals. Some amount of care must be exercised in the design of the AFC circuit so that it is not to confused by the shallow anti-lock positions above and below resonance on the discriminator curve of FIG. 5e. Otherwise, the discriminator curve of FIG. 5e is exceptionally sharp and works well.

Yet another aspect of this invention concerns the ability to actually compute a value for the relative phase angle $\alpha$ between the reference and signal arms. Close to the AFC lock-point, with $\beta=1$, equation (10) reduces to:

$$\frac{V^2(70 \text{ kHz component})}{P_o} = 2 \left( \frac{2Q_o}{\omega_o} \right)^2 \Delta\omega\epsilon \cos(\omega_m t) \quad (13)$$

Then, under the conditions that the AFC loop is closed and $\Delta\omega=0$, the following equations may be derived:

$$\frac{V_I}{\sqrt{P_o}} = -\frac{1-\beta^2}{(\beta+1)^2} \cos(\alpha) - \frac{4\beta Q_o}{\omega_o(\beta+1)^2} \epsilon\cos(\omega_m t) \sin(\alpha) \quad (14)$$

$$(V_Q \sqrt{P_o}) = -\frac{1-\beta^2}{(\beta+1)^2} \sin(\alpha) + \frac{4\beta Q_o}{\omega_o(\beta+1)^2} \epsilon\cos(\omega_m t) \cos(\alpha) \quad (15)$$

The two signals I and Q can then in principle be detected independently and the quantity $\alpha$ calculated from either the d.c. terms (e.g. those without the $\cos(\omega_m t)$ factor) or the a.c. terms (e.g. those with the $\cos(\omega_m t)$ factor). The a.c. terms are at the AFC frequency, 70 kHz in this embodiment, and can be expected to be more reliable in determining $\alpha$ than the corresponding d.c. terms. The angle $\alpha$ may then be calculated directly according to the formula:

$$\alpha = \tan^{-1}\left( \frac{V_I(70 \text{ kHz})}{V_Q(70 \text{ kHz})} \right) \quad (16)$$

Alternatively, the angle α may be continuously tracked, using known resolver techniques, by generating an artificial angular value α', and locking it to the real angle α. In that case, the sin (α) and cos (α) terms in equations (12) and (13) would replace the orthogonal resolver signals normally used in such a circuit.

The capability to actually measure α is an extremely important benefit of this invention. Knowing α, $V_I$, $V_Q$, and $P_o$, it is possible to calculate, according to equations (7) and (8), pure dispersion (Im[Γ(Δω)]) and pure absorption (Re[Γ(Δω)]) EPR signals even though the I and Q signals are not pure real and imaginary components, respectively. In other words, it is only necessary to measure α; it is not necessary, utilizing this invention, to actually adjust the phase shifter 22 in the reference arm in order to obtain pure EPR modes. Mixtures of dispersion and absorption in the I and Q channels can be readily separated, knowing α! An extremely practical consequence of this is that the phase shifter 22 can be eliminated altogether.

Figure 7:
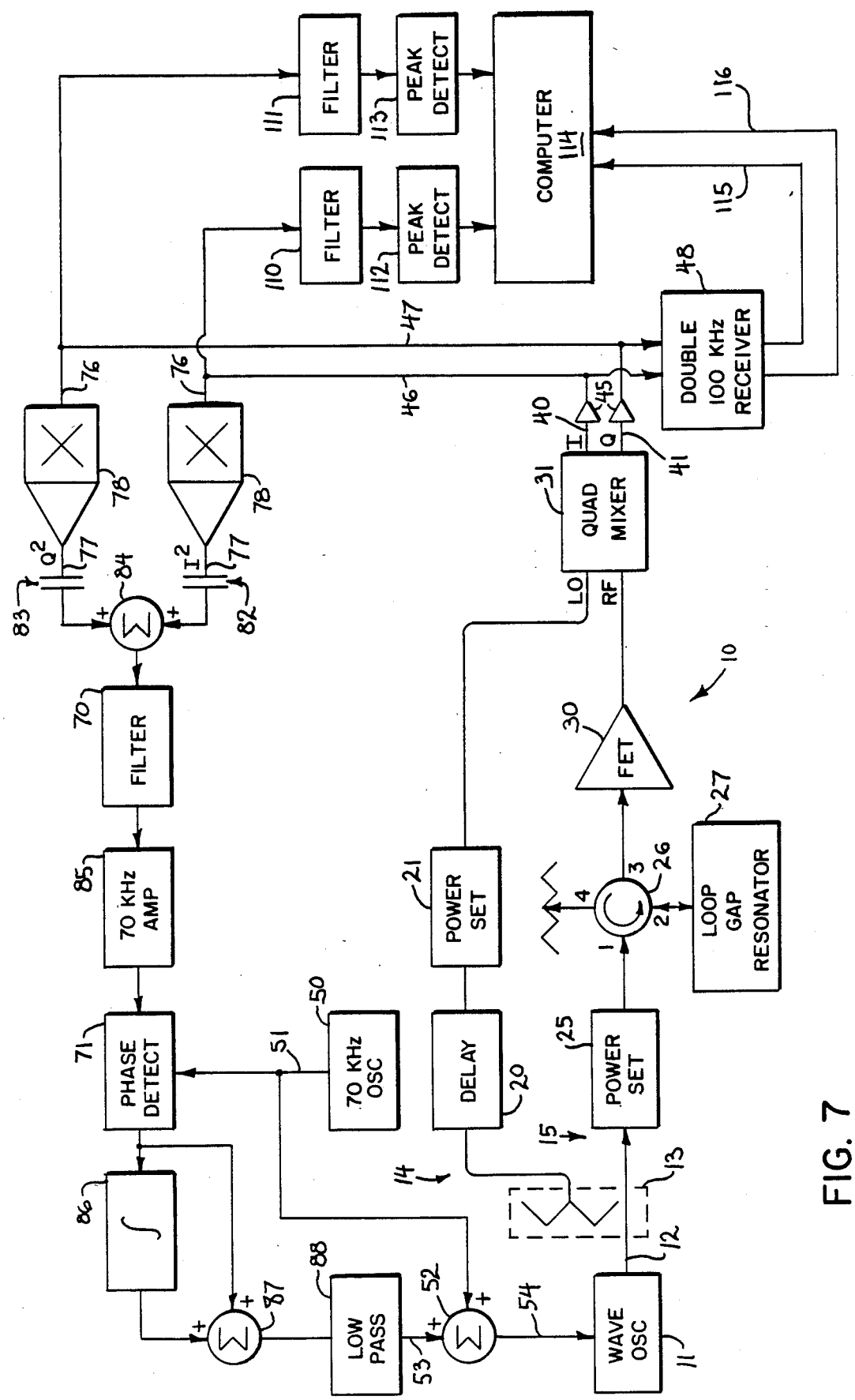
FIG. 7 is a block diagram of a third embodiment of a spectrometer according to the present invention.

An exemplary embodiment of an apparatus for implementing the above described computations is shown in FIG. 7. The reference arm and AFC circuits of FIG. 7 are similar to those of the FIG. 1 embodiment described above, except for the conspicuous absence of a phase shifter 22 in the reference arm. Instead, the angle α can take on any value at all and does not need to be adjusted. It is therefore important that this embodiment include the previously described aspects of this invention for (i) providing I and Q signals simultaneously, and (ii) maintaining AFC lock independent of α.

The I and Q signals 46 and 47 are each connected to the input of a filter 110 and 111, respectively. The filters 110 and 111 select the desired components to be used in computing α. As discussed above, if the d.c. terms of equations (15) and (16) are to be used, the filters 110 and 111 are low pass, with a corner frequency below the AFC frequency. If the a.c. terms are to be used, then the filters 110 and 111 are band pass, centered at the AFC frequency.

In this embodiment, it is preferred to utilize the a.c. components, as stated above. In that case, the output of filters 110 and 111 are connected to peak detectors 112 and 113 to convert the a.c. signals to a d.c. value proportional to their magnitude. It should be apparent to those skilled in the art that if the d.c. components are used, the peak detectors 112 and 113 could be bypassed, as the d.c. signals are already a magnitude representation.

The outputs of the peak detectors 112 and 113 are connected as input to a computer system 114. In the computer, the d.c. values from the peak detectors 112 and 113, or the direct d.c. values from the filters 110 and 111 if the d.c. components used, are converted to digital information. Similarly, the outputs 115 and 116 corresponding to the I and Q channels, respectively, are also connected to computer system 114 and are likewise converted to digital.

The computer system 114 implements software programs (not shown) to periodically acquire the converted digital values from the peak detectors 112 and 113, and compute α according to equation 16. Alternatively, as previously stated, a digital resolver algorithm could be implemented in the computer 114, as is well known in the art, to track α.

Once α has been computed, the computer system 114 computes pure dispersion and pure absorption values for the received signals 115 and 116 according to equations (7) and (8). These pure absorption and pure dispersion values are then identical to the values obtained in prior systems, with the important exception that in the apparatus of FIG. 7, no phase adjustment is necessary. The computed pure absorption and pure dispersion values are then processed in the normal fashion, as is well known in the art.

It should be appreciated by those skilled in the art that many variations of the disclosed embodiments are within the scope of this invention. For example, the reference arm bridge may be implemented in waveguide, coax, microstrip, or a combination of those technologies. The elimination of a phase shifter in the reference arm is also important in that the use of known micro-strip techniques in the bridge construction are greatly facilitated. Similarly, the computation performed by the computer 114 could equivalently be performed by analog circuitry.

We claim:

1. In an electron paramagnetic resonance (EPR) spectrometer which includes a reference arm microwave bridge comprised of a reference arm having a reference arm output, a signal arm having a signal arm output, the signal arm including a microwave circulator connected to a resonant cavity, and mixing means having a predetermined noise figure, the mixing means being connected to the outputs of the reference and signal arms for simultaneously producing first and second EPR output signals which are in phase quadrature with respect to each other, the improvement wherein;

the signal arm includes a microwave amplifier connected between the circulator and the signal arm output, the microwave amplifier having a noise figure which is less than the noise figure of the mixing means.

2. The EPR spectrometer according to claim 1 in which the microwave amplifier is a field effect transistor (FET) amplifier with a noise figure less than approximately 3 dB and a voltage gain of greater than approximately 10 dB.

3. An electron paramagnetic resonance (EPR) spectrometer, comprising:

a variable frequency microwave oscillator producing a microwave output signal at a frequency determined by a frequency control signal;

a reference arm bridge connected to the microwave oscillator, the reference arm bridge, including:
a reference arm;
a signal arm; and
a resonator coupled to the signal arm;

quadrature decoding means connected to the reference arm and signal arm of the reference arm bridge for simultaneously producing first and second detected signals in quadrature with respect to each other;

discriminator means connected to the first and second detected signals for deriving a discriminator signal indicating the relative difference between the frequency of the microwave oscillator and the resonant frequency of the resonator, and with the discriminator signal being independent of the relative phase angle between the signals in the reference and signal arms; and AFC circuit means connected to the discriminator means and the oscillator means, the AFC circuit means producing the frequency control signal for maintaining the microwave oscillator frequency near the resonant frequency of the resonator based on the discriminator signal.

4. The EPR spectrometer of claim 3 in which the discriminator means comprises:
first squaring means connected to the first detected signal for producing a first squared value from the first detected signal;
second squaring means connected to the second detected signal for producing a second squared value from the second detected signal; and
summing means connected to the first and second squared values for producing the discriminator signal as the sum of the first and second squared values.

5. The EPR spectrometer of claim 4 in which the AFC circuit means includes means for frequency modulating the microwave oscillator at an AFC modulation frequency, and the discriminator means includes means for extracting only that component of the sum of the squares of the first and second detected signals at the AFC modulation frequency for use as the discriminator signal.

6. The EPR spectrometer of claim 5 in which the first and second detected signals each include direct current (d.c.) components and alternating current (a.c.) components at the AFC modulation frequency, and the first and second squaring means performs a weighted squaring, giving a lesser gain to the d.c. components than to the a.c. components.

7. The EPR spectrometer of claim 4 in which the squaring means comprises an analog multiplier.

8. In a microwave apparatus of the type including (1) a microwave resonator having a resonant frequency and producing a complex reflected signal having a real part and an imaginary part, (2) a microwave oscillator having a variable frequency output and connected to drive the resonator, (3) automatic frequency control (AFC) means for locking the microwave oscillator output frequency to the resonant frequency of the microwave resonator by (a) frequency modulating the microwave oscillator output at an AFC modulation frequency (b) generating a discriminator signal which indicates the magnitude and polarity of the difference between the microwave oscillator output frequency and the resonant frequency of the resonator, and (c) correcting the frequency of the microwave oscillator output to maintain the center frequency of the frequency modulated microwave oscillator output near the resonant frequency of the resonator, and (4) detection means connected to the resonator output for producing a detector output signal, the detector output signal comprising the imaginary component of the complex reflected signal from the resonator, the improvement wherein the AFC means includes:
squaring means having an input and an output, the input of the squaring means being connected to the detector output signal, and the output of the squaring means having a value which is approximately equal to the detector output signal squared; and
filter means connected to the output of the squaring means for producing a filter output signal, the filter output signal comprising the component of the squaring means output at the AFC modulation frequency for use as the discriminator signal.

9. In an electron paramagnetic resonance (EPR) spectrometer of the type which includes (1) a reference arm microwave bridge, including a reference arm for producing a reference arm output and a signal arm for producing a signal arm output, in which the relative phase between the signal arm and reference arm outputs is defined by a relative phase angle $\alpha$, (2) mixer means connected to the reference arm and signal arm outputs for simultaneously producing first and second mixer output signals, the first and second mixer output signals being in phase quadrature with respect to each other, and (3) receiver means connected to the first and second mixer output signals for producing first and second EPR signals corresponding, respectively, to the first and second mixer output signals, the improvement wherein the EPR spectrometer further includes mode correction means for producing at least one pure EPR mode value derived from the first and second EPR signals and the first and second mixer output signals, the mode correction means comprising:
processor means which includes memory means;
first interface means connected to the first and second mixer output signals and to the processor means for producing first and second magnitude values corresponding, respectively, to the magnitudes of a predetermined frequency component of the first and second mixer output signals, and for storing the first and second magnitude values in the memory means;
a first set of instructions in the memory means for execution by the processor means to compute a value for the relative phase angle $\alpha$ based on the first and second magnitude values, and to store the computed value for $\alpha$ in the memory means;
second interface means connected to the first and second EPR signals and to the processor means for producing first and second EPR values corresponding, respectively, to the first and second EPR signals, and for storing the first and second EPR values in the memory means;
a second set of instructions in the memory means for execution by the processor means to compute said at least one pure EPR mode value based on the first and second EPR values and the value for the relative phase angle $\alpha$.

10. The electron paramagnetic resonance (EPR) spectrometer as recited in claim 9 in which the pure EPR mode value is a pure absorption mode value.

11. The electron paramagnetic resonance (EPR) spectrometer as recited in claim 9 in which the pure EPR mode value is a pure dispersion mode value.

12. The electron paramagnetic resonance (EPR) spectrometer as recited in claim 9 in which two pure EPR mode values are computed one pure EPR mode value being a pure absorption mode value and the other pure EPR mode value being a pure dispersion mode value.

* * * * *